United States Patent
Kulkarni et al.

(10) Patent No.: US 9,589,615 B2
(45) Date of Patent: Mar. 7, 2017

(54) DIGITALLY TRIMMABLE INTEGRATED RESISTORS INCLUDING RESISTIVE MEMORY ELEMENTS

(71) Applicant: Intel Corporation, Santa Clara, CA (US)

(72) Inventors: Jaydeep P. Kulkarni, Portland, OR (US); Ashoke Ravi, Hillsboro, OR (US); Dinesh Somasekhar, Portland, OR (US); Ganesh Balamurugan, Hillsboro, OR (US); Sudip Shekhar, Woodinville, WA (US); Tawfiq Musah, Portland, OR (US); Tzu-Chien Hsueh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/750,670

(22) Filed: Jun. 25, 2015

(65) Prior Publication Data

US 2016/0379695 A1 Dec. 29, 2016

(51) Int. Cl.
*G11C 11/00* (2006.01)
*G11C 11/16* (2006.01)
*G11C 13/00* (2006.01)

(52) U.S. Cl.
CPC ........ *G11C 11/161* (2013.01); *G11C 13/0002* (2013.01)

(58) Field of Classification Search
CPC .......................... G11C 11/161; G11C 13/0002
See application file for complete search history.

(56) References Cited

U.S. PATENT DOCUMENTS

| | | | | |
|---|---|---|---|---|
| 2002/0136053 A1* | 9/2002 | Asano | ..................... | G11C 11/16 365/158 |
| 2004/0160809 A1* | 8/2004 | Lin | ........................ | G11C 11/16 365/158 |
| 2005/0276097 A1* | 12/2005 | Perner | ..................... | G11C 11/16 365/158 |
| 2006/0146602 A1* | 7/2006 | Lin | ........................ | G11C 5/063 365/171 |
| 2006/0290547 A1* | 12/2006 | Hazucha | .................. | G05F 1/56 341/119 |
| 2008/0170432 A1* | 7/2008 | Asao | ....................... | G11C 11/16 365/171 |

(Continued)

OTHER PUBLICATIONS

H. S. P. Wong, "Emerging Memories: Are they energy efficient enough?" Stanford University, Department of Electrical Engineering, 2011.

(Continued)

*Primary Examiner* — Khamdan Alrobaie

(74) *Attorney, Agent, or Firm* — Schwabe, Williamson & Wyatt, P.C.

(57) ABSTRACT

Embodiments include a resistor, coupled on a signal path, that includes one or more resistive memory elements, such as one or more magnetic tunnel junctions (MTJs). The resistance of the resistive memory elements may be digitally trimmable to adjust a resistance of the resistor on the signal path. The resistor may be incorporated into an analog or mixed signal circuit to pass an analog signal on the signal path. Other embodiments may be described and claimed.

23 Claims, 15 Drawing Sheets

(56) References Cited

U.S. PATENT DOCUMENTS

| | | | |
|---|---|---|---|
| 2012/0069641 A1* | 3/2012 | Katayama | G11C 11/16 365/158 |
| 2015/0035032 A1* | 2/2015 | Kang | H01L 27/228 257/295 |
| 2015/0092479 A1* | 4/2015 | Dong | G11C 7/1075 365/158 |

OTHER PUBLICATIONS

C-T. Chao, "Temperature dependence of electrical transport and magnetization reversal in magnetic tunnel junction" IEEE Transactions on Magnetics, Jun. 2010.

S. Amara-Dababi, H. Bea, R. C. Sousa, C. Baraduc and B. Dieny, "Correlation between write endurance and electrical low frequency noise in MgO based magnetic tunnel junctions" Applied Physics Letters 102, 052404, (2013).

D. Johns and K. Martin, "Analog Integrated Circuit Design", John Wiley and Sons Limited (2012).

S. Gondi and B. Razavi, "Equalization and Clock and Data Recovery Techniques for 10-Gb/s CMOS Serial-Link Receivers", pp. 1999-2011, IEEE Journal of Solid State Circuits, vol. 42, No. 9, Sep. 2007.

F. Behbahani, Y. Kishigami, J. Leete, and A. Abidi, "CMOS Mixers and Polyphase Filters for Large Image Rejection", pp. 873-887, IEEE Journal of Solid State Circuits, vol. 36, No. 6, Jun. 2001.

Y. Tokunaga, S. Sakiyama, A. Matsumoto, S. Dosho, "An On-Chip CMOS Relaxation Oscillator with Power Averaging Feedback Using a Reference Proportional to Supply Voltage", pp. 404-406, International Solid-State Circuits Conference, 2009.

A. Hajimiri, S. Limotyrakis, T. Lee, "Phase Noise in Multi-Gigahertz CMOS Ring Oscillators", pp. 49-52, IEEE Custom Integrated Circuits Conference, 1998.

H. S. Kim, C. Ornelas, K. Chandrashekar, P. Su, P. Madoglio, Y. Li, and A. Ravi, "A Digital Fractional-NPLL with a 3mW0.004mm26-bit PVT and Mismatch Insensitive TDC", pp. 193-196, IEEE Custom Integrated Circuits Conference, 2012.

K. Chandrashekar, S. Pellerano, P. Madoglio, A. Ravi, Y. Palaskas, "A 32nmCMOS All-Digital Reconfigurable Fractional Frequency Divider for LO Generation in multi-standard SoC Radios With On-the-Fly Interference Management", pp. 352-354, International Solid-State Circuits Conference, 2012.

\* cited by examiner

DIGITALLY TRIMMABLE INTEGRATED RESISTORS INCLUDING RESISTIVE MEMORY ELEMENTS

FIELD

Embodiments of the present invention relate generally to the technical field of electronic circuits, and more particularly to digitally trimmable integrated resistors including resistive memory devices.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Passive resistors used in many electronic circuits, such as analog, mixed-signal, and/or radio frequency circuits, are formed using poly, diffusion, or N-well resistors. Key attributes for passive resistors are linearity, temperature co-efficient, and variability. These passive resistors occupy significant active silicon area, and are typically enclosed in special layout structures (e.g., guard rings).

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Figure 1:
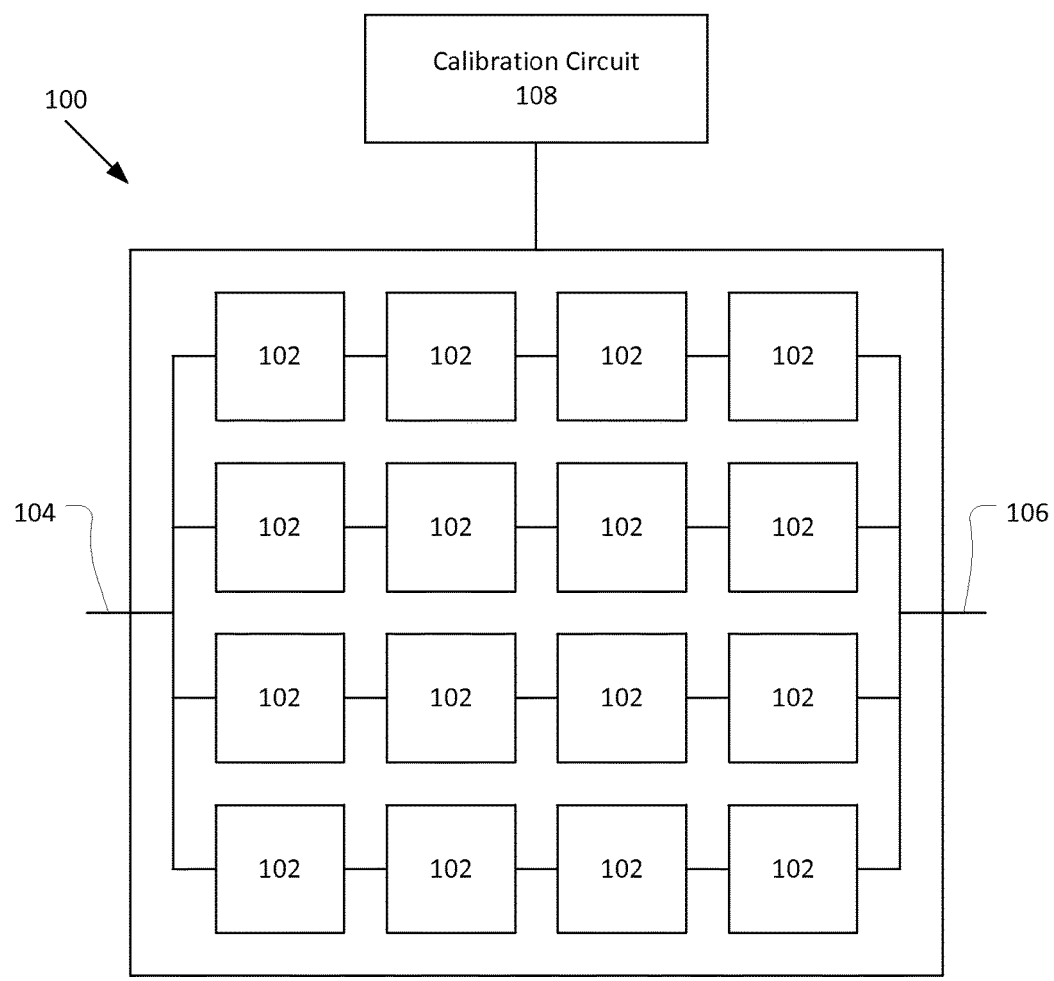
FIG. 1 schematically illustrates a resistor and calibration circuit in accordance with various embodiments.

FIG. 1 schematically illustrates digitally trimmable resistor 100 in accordance with various embodiments. The digitally trimmable resistor 100 includes a plurality of resistor cells 102 that are coupled to one another in a series-parallel combination between terminals 104 and 106. For example, the resistor cells 102 may be arranged in a plurality of rows. The resistor cells 102 may be coupled in series with the other resistor cells 102 of the same row, and may be coupled in parallel with the resistor cells of the other rows. The terminals 104 and 106 may be coupled on a signal path, and the resistor 100 may pass a signal between the terminals 104 and 106 on the signal path. Other configurations of the resistor cells 102 may be used in other embodiments, such as the configuration of resistor cells 502 in the resistor 500 of FIG. 5, which is discussed further below.

In various embodiments, the resistor cells 102 may include one or more resistive memory elements. Accordingly, the resistance value of each resistor cell 102 may be switchable between two or more values (e.g., upon application of an electric current or magnetic field). For example, when the resistive memory elements are used in a memory application, the resistive memory elements may have a first resistance value to store a logic 0 bit, and may have a second resistance value to store a logic 1 bit. The resistor cells 102 may be individually controllable (e.g., by a calibration circuit 108 coupled to the resistor cells 102) to switch between the first and second resistance values. Accordingly, the resistance value of the resistor 100 (e.g., as presented across terminals 104 and 106) may be adjusted by adjusting the resistance values of one or more of the resistor cells 102.

The resistor 100 may include any suitable number of one or more resistor cells 102. Although the resistor 100 is shown in FIG. 1 with 4 rows that each include 4 resistor cells 102 coupled in series, other embodiments may include other numbers of rows and/or numbers of resistor cells 102 within a row. In some embodiments, the number of rows may be different than the number of resistor cells 102 within each row. Additionally, or alternatively, different rows may have different numbers of resistor cells 102.

In various embodiments, the resistive memory elements included in the resistor cells 102 may be formed in back-end-of-line (BEOL) processing. Accordingly, the resistor 100 may be formed in higher metal layers (e.g., metal layer 3 and/or metal layer 4) of the integrated circuit above the active substrate region, and may not occupy the active substrate area that is occupied by conventional resistors. Additionally, or alternatively, the BEOL integration of the resistor 100 may provide lower parasitics compared with conventional passive resistors.

Some examples of resistive memory elements that may be used for the resistor cells 102 include resistive memory elements used in spin transfer torque magnetic random access memory (STT-MRAM) cells, conducting bridge random access memory (CBRAM) cells, phase change random access memory (PCRAM) cells, and resistive random access memory (RRAM). STT-MRAM cells may include a magnetic tunnel junction (MTJ) element that includes a non-magnetic spacer layer disposed between two ferromagnetic layers. The value of the STT-RAM cell is indicated by the relative magnetic orientation of the ferromagnetic layers, and switching between the two states occurs due to spin-polarized current flowing through the MTJ element.

CBRAM employs a solid state electrolyte in which mobile metal ions create a conductive bridge between two electrodes under the influence of an electric field. PCRAM employs the difference in resistivity between crystalline and amorphous phases of a chalcogenide compound under the influence of electric current. RRAM uses metal oxides, such as nickel oxide (NiO) and/or hafnium oxide (HfO$_2$). RRAM elements include an insulator disposed between two metal layers. The resistance of the insulator can be modulated by the application of an electric field.

In CBRAM, PCRAM, and RRAM cells, the resistance difference between the two states may be orders of magnitude. In contrast, in STT-MRAM cells, the resistance difference between the two states may be less, such as about 2× (e.g., the second resistance may be twice the first resistance). Accordingly, MTJ elements, which are employed by STT-MRAM cells, may be especially useful in the digitally trimmable resistor 100 to allow fine trimming of the resistance value. However, other types of resistive memory elements may be used in the digitally trimmable resistor 100 in other embodiments.

Additionally, MTJ elements have low voltage operation and integrate easily with complementary metal-oxide-semiconductor (CMOS) devices. Furthermore, MTJ elements have a linear temperature co-efficient, low sensitivity to voltage differences (in parallel state), and linear 1/f noise behavior, making MTJ elements suitable for use as resistors in analog circuits.

Figure 2:
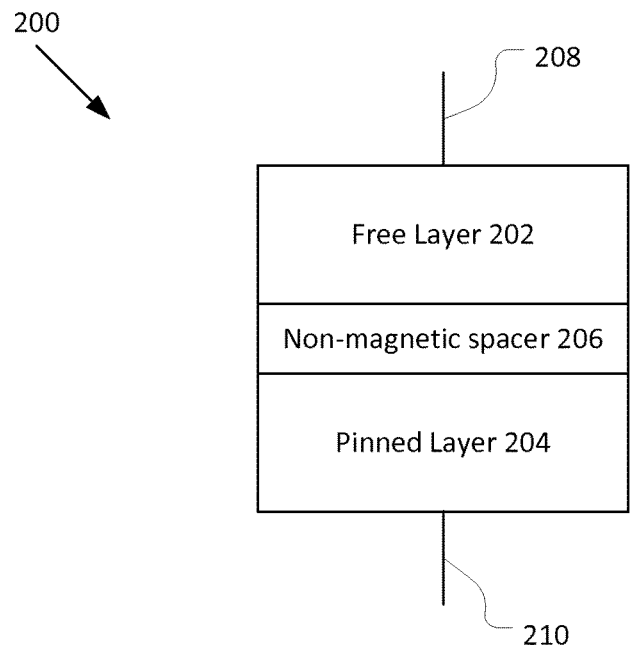
FIG. 2 schematically illustrates a magnetic tunnel junction (MTJ) element with a free layer and a pinned layer, in accordance with various embodiments.

FIG. 2 illustrates an MTJ element 200 that may be included in the resistor cells 102 in accordance with various embodiments. The MTJ element 200 may include a free layer 202 (also referred to as a free magnet layer) and a pinned layer 204 (also referred to as a fixed magnet layer). The free layer 202 and pinned layer 204 may be magnetic. The MTJ element 200 may further include a non-magnetic spacer 206 disposed between the free layer 202 and the pinned layer 204. The non-magnetic spacer 206 may include, for example magnesium oxide (MgO). The MTJ element 200 may further include a terminal 208 coupled to the free layer 202 and a terminal 210 coupled to the pinned layer 204.

In various embodiments, the magnetic orientation of the pinned layer 204 may be fixed, while the magnetic orientation of the free layer 202 may change based on the direction of current flowing through the MTJ element 200. The MTJ element 200 may be switchable between two resistive states (e.g., presented across terminals 208 and 210) according to a magnetic orientation of the free layer 202. For example, in a parallel state, the free layer 202 may be magnetically oriented parallel with the pinned layer 204, while in an anti-parallel state, the free layer 202 may be magnetically oriented anti-parallel with the pinned layer 204. The MTJ element 200 may have a first resistance in the parallel state and a second resistance in the anti-parallel state. The second resistance may be higher than the first resistance (e.g., by a factor of 2).

Figure 3:
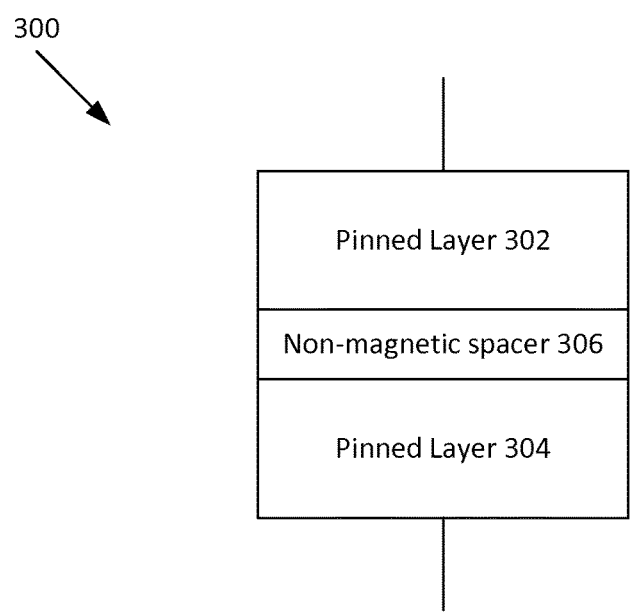
FIG. 3 schematically illustrates an MTJ element with two pinned layers, in accordance with various embodiments.

FIG. 3 illustrates an alternative MTJ element 300 in accordance with various embodiments. The MTJ element 300 includes two pinned layers 302 and 304, and a non-magnetic spacer layer 306. Accordingly, the MTJ element 300 may have a fixed resistance value. The MTJ element may be used for one or more (e.g., all) of the resistor cells 102 in the resistor 100, but may not allow for trimming the resistance value.

Figure 4A:
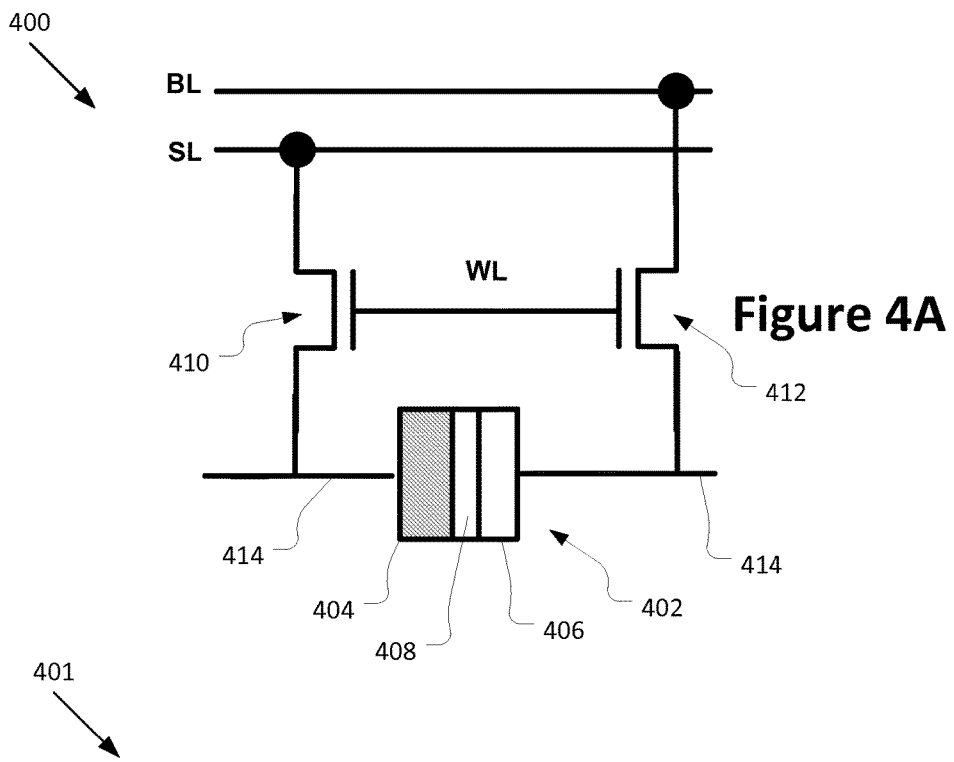
FIG. 4A schematically illustrates resistor cell including an MTJ element, in accordance with various embodiments.

FIG. 4A illustrates a resistor cell 400 that includes a MTJ element 402, in accordance with various embodiments. In some embodiments, the resistor cell 400 may be incorporated into an array of resistor cells 400, such as the resistor cells 102 of resistor 100. In other embodiments, the resistor cell 400 may be used independently as a stand-alone adjustable resistor.

In various embodiments, the MTJ element 402 may include a pinned layer 404, a free layer 406, and a spacer layer 408. The resistor cell 400 may further include a transistor 410 and a transistor 412. Additionally, the resistor cell 400 may include a bit line (BL), a source line (SL), and/or a word line (WL). The transistor 410 may be coupled with and between the source line and the pinned layer 404 of the MTJ element 402, while the transistor 412 may be coupled with and between the bit line and the free layer 406 of the MTJ element 402. The transistors 410 and/or 412 may be metal-oxide-semiconductor field-effect transistor (MOSFET) devices in some embodiments, such as n-type MOSFET devices. The word line may be coupled to the gate terminals of the transistors 410 and 412.

In various embodiments, the resistor cell 400 may provide a resistance on signal path 414 and may pass a signal (e.g., an analog signal) on the signal path 414. The value of the resistance may be switchable between a first resistance value (e.g., when the MTJ element 402 is in the parallel state) and a second resistance value (e.g., when the MTJ element 402 is in the anti-parallel state). In various embodiments, the resistor cell 400 may receive a word line signal at the word line WL to selectively activate the resistor cell to allow the resistance to be changed. The word line signal may have a first value (e.g., logic 1) to turn on the transistors 410 and 412 and thereby activate the resistor cell 400. The word line signal may have a second value (e.g., logic 0) to turn off the transistors 410 and 412 and thereby deactivate the resistor cell 400.

When the resistor cell 400 is deactivated, the resistance remains in the previously programmed state and does not change (e.g., regardless of the values on the bit line BL and source line SL. When the resistor cell 400 is activated, the resistance of the MTJ element 402 may depend on the values of the bit line signal at the bit line BL and the source line signal at the source line SL. For example, if the bit line signal is high and the source line signal is low, the current will flow from the bit line BL to the source line SL via the MTJ element 402. Accordingly, the current will flow from the free layer 406 to the pinned layer 404 of the MTJ element 402, thereby causing the MTJ element 402 to have the first resistance. Alternatively, if the bit line signal is low and the source line signal is high, current will flow from the source line SL to the bit line BL via the MTJ element 402. Accordingly, the current will flow from the pinned layer 404 to the free layer 406 of the MTJ element 402, thereby causing the MTJ element 402 to have the second resistance.

In various embodiments, the resistor cell 400 may not include a transistor on the signal path 414. Accordingly, the resistor cell 400 may have reduced harmonic distortion compared with trimmable resistors that include a transistor on the signal path. Additionally, or alternatively, in trimmable resistors that include a transistor on the signal path, the transistor may be of relatively large size to reduce the distortion. In contrast, the transistors 410 and 412 may be minimum size or close to minimum size (e.g., according to the semiconductor process used).

Figure 4B:
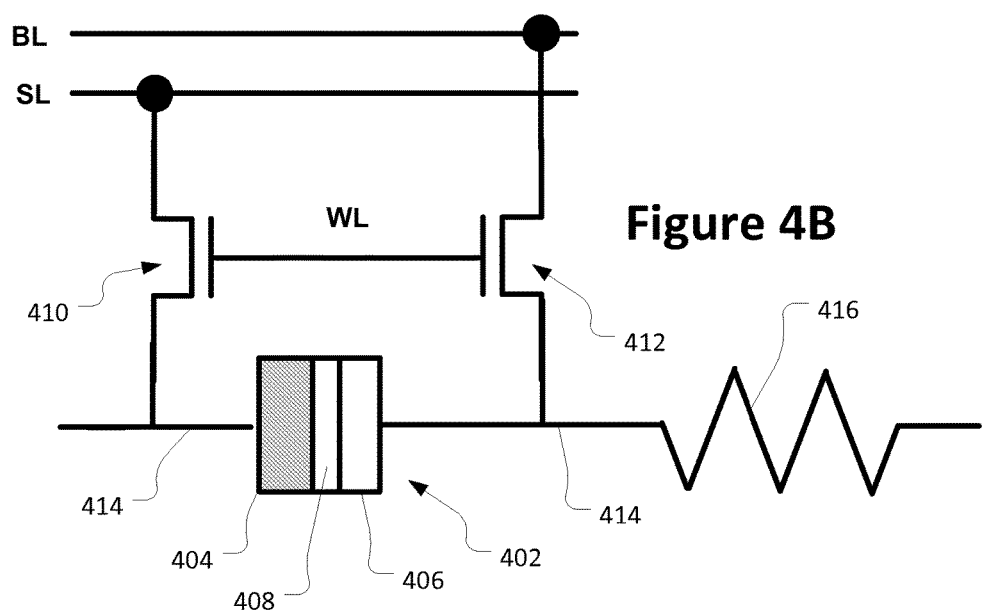
FIG. 4B schematically illustrates another resistor cell including an MTJ element, in accordance with various embodiments.

FIG. 4B illustrates another resistor cell 401 that includes a passive resistor 416 coupled to the MTJ element 402 (e.g., on signal path 414). The passive resistor 416 may have a fixed resistance value (e.g., not trimmable). The passive resistor 416 may be coupled to the free layer 406 (as shown) or the pinned layer 404. The MTJ element 402 may provide fine tuning of the resistance value provided by the resistor cell 401. For example, in some embodiments, the resistance value of the passive resistor 416 may be greater than the range of values provided by the MTJ element 402.

The passive resistor 416 may be any suitable type of resistor. For example, in some embodiments, the passive resistor 416 may be a poly, diffusion, or N-well resistor. Alternatively, in some embodiments, an MTJ element with two pinned layers (e.g., the MTJ element 300) may be used for the passive resistor 416.

Although the passive resistor 416 is shown in FIG. 4 coupled to a single MTJ resistor cell, in some embodiments, the passive resistor 416 may be coupled to a series-parallel combination of resistor cells to provide fine-tuning of the overall resistance.

Figure 5:
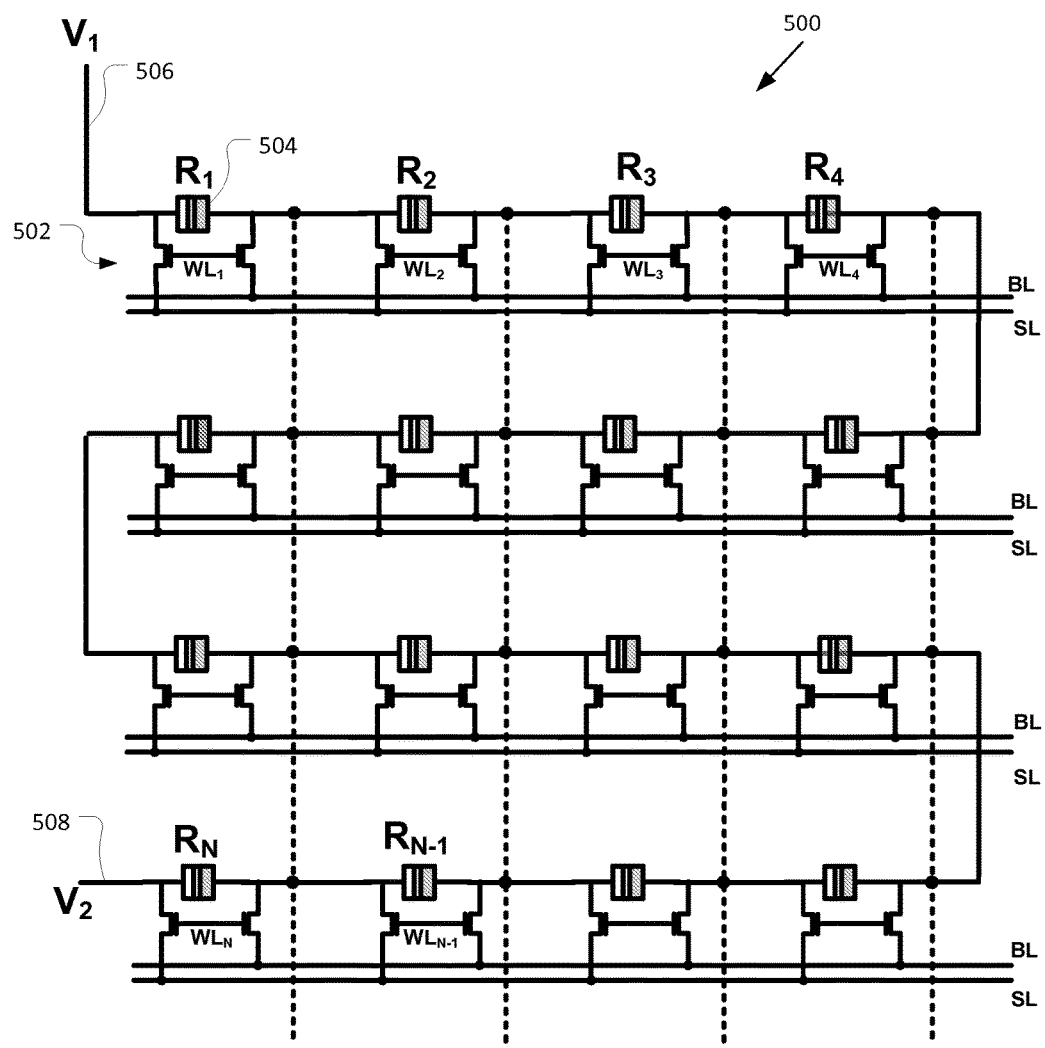
FIG. 5 schematically illustrates a resistor including a plurality of MTJ resistor cells coupled in a series-parallel combination, in accordance with various embodiments.

FIG. 5 illustrates a resistor 500 that includes a plurality of resistor cells 502 coupled to one another in a series-parallel combination, in accordance with various embodiments. In embodiments, the resistor cells 502 may correspond to the resistor cell 400 and may include respective MTJ elements 504. The resistor cells 502 may receive different word line signals (e.g., $WL_1$, $WL_2$, ... $WL_{N-1}$, $WL_N$). In some embodiments, the resistor cells 502 may receive the same bit line signal and/or source line signal.

The resistor cells 502 may be coupled in series with one another between terminals 506 and 508 of the resistor 500. Additionally, resistor cells 502 may be coupled in parallel with other resistor cells, for example as shown. Other configurations and/or number of resistor cells 502 may be used in other embodiments.

The series-parallel configuration of the resistor cells 502 in resistor 500 may allow fine tuning of the resistance provided by the resistor 500 by controlling the resistance of individual resistor cells 502. Additionally, or alternatively, the series-parallel configuration of the resistor cells 502 may reduce the voltage drop over individual resistor cells 502 to avoid overloading the resistor cells 502.

The resistor 100 (e.g., including one or more MTJ elements 200, MTJ elements 300, resistor cells 400, and/or resistor cells 401) and/or resistor 500 may be incorporated into any suitable circuit, such as an analog or mixed signal circuit (e.g., a circuit that uses both analog and digital signals). In some embodiments, the resistor 100 and/or 500 may provide a digitally trimmable resistance for the circuit. Some example circuits that incorporate the resistor 100 and/or 500 are shown in FIGS. 6-15. The resistors are shown in FIGS. 6-15 to each include one resistor cell that includes an MTJ element (e.g., resistor cell 400 that includes MTJ element 402). However, one resistor cell is shown for ease of illustration, and in some embodiments, the resistors may include a plurality of resistor cells coupled to one another in a series-parallel combination (e.g., as shown for resistor 500 in FIG. 5) to allow trimming of the resistance provided by the resistors over a range of values. Additionally, or alternatively, in some embodiments, the resistors may include another type of resistive memory element, and/or may include a non-trimmable resistive memory element (e.g., the resistor cell 401).

In some embodiments, the resistor 100 and/or 500 may be incorporated into an analog-to-digital conversion (ADC) circuit or a digital-to-analog conversion (DAC) circuit, such as a flash ADC circuit, sigma-delta ADC circuit, binary weighted DAC circuit, two-stage resistive DAC circuit, two-dimensional resistive DAC circuit circuit, R-2R ladder DAC circuit, and/or thermometer code DAC circuit. The resistor 100 and/or 500 may be used, for example, to form a resistor ladder to generate internal reference voltages for ADC or DAC. Alternatively, or additionally, the resistor 100 and/or 500 may be used to provide a calibrated resistance value to improve bit resolution of the ADC circuit or DAC circuit.

Figure 6:
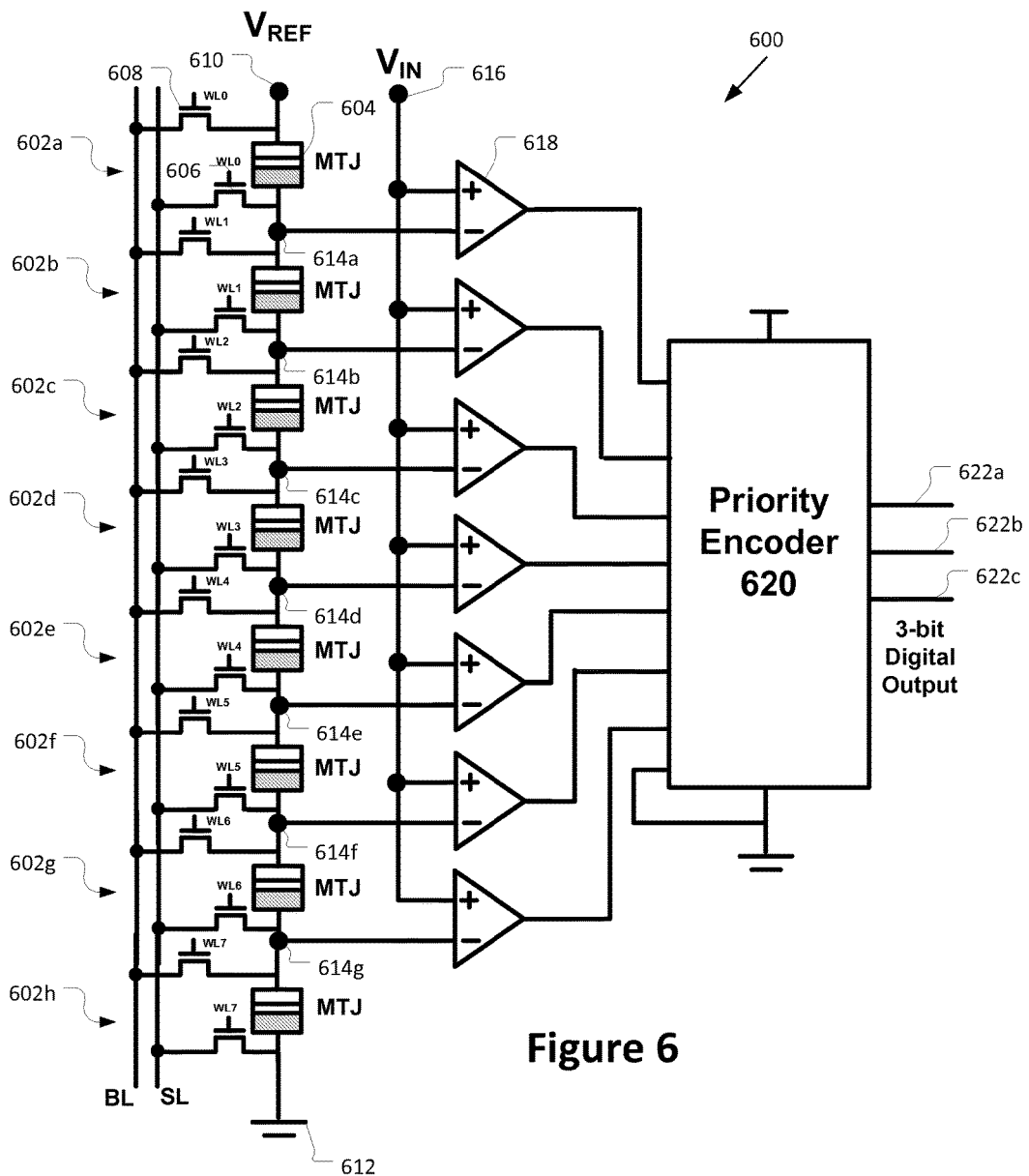
FIG. 6 schematically illustrates a flash analog-to-digital conversion (ADC) circuit including resistors with one or more resistive memory elements, in accordance with various embodiments.

FIG. 6 illustrates a flash ADC circuit 600 (hereinafter "circuit 600") that incorporates a plurality of trimmable resistors 602a-h in accordance with various embodiments. The trimmable resistors 602a-h may each include one or more resistor cells having one or more resistive memory elements. The trimmable resistors 602a-h are shown in FIG. 6 to each include one resistor cell that includes an MTJ 604, first transistor 606, and second transistor 608 for ease of illustration. However, in some embodiments, the trimmable resistors 602a-h may include a plurality of resistor cells coupled to one another in a series-parallel combination (e.g., as shown for resistor 500 in FIG. 5) to allow trimming of the resistance provided by the resistors 602a-h over a range of values.

In various embodiments, the resistors 602a-h may be coupled to one another to form a resistor ladder. For example, the MTJs 604 may be coupled in series with one another between a reference voltage terminal 610 and a ground terminal 612. The reference voltage terminal 610 receive a reference voltage Vref, and the ground terminal 612 may be coupled to a ground potential. Accordingly, the resistors 602a-h may provide internal reference voltages at respective reference nodes 614a-g that are between adjacent resistors 602a-h. The internal reference voltages may be stepped between ground and Vref.

In various embodiments, the circuit 600 may further include other various circuit elements, such as, input terminal 616, comparators 618, and a priority encoder 620. The input terminal 616 may receive an analog input voltage Vin. Each comparator 618 may include a first input that is coupled to the input terminal 616 to receive the input voltage Vin, and a second input terminal that is coupled to a respective reference node 614a-g to receive a respective one of the internal reference voltages. An output of each comparator 618 may be coupled to a respective input of the priority encoder 620. The priority encoder 620 may further receive a ground potential at another input.

In various embodiments, the priority encoder 620 may generate a digital output signal at output terminals 622a-c having a value based on the input signals received at the inputs of the priority encoder 620 (e.g., from the comparators 618). For example, as shown, the priority encoder 620 may be an 8:3 priority encoder. The priority encoder 620 may use the output signals of the comparators 618 to determine to which of eight voltage ranges between 0 and Vref that Vin belongs, and may assign Vin a 3-bit value based on the determination. The priority encoder 620 may output the 3-bit value on the output terminals 622a-c (e.g., one bit on each output terminal).

In various embodiments, the resistance value of one or more of the resistors 602a-h may be adjusted during a calibration process (e.g., by a calibration circuit such as calibration circuit 108). For example, the resistance value of one or more of the resistors 602a-h may be adjusted to provide even spacing between the internal reference voltages at the respective nodes 614a-g (e.g., spacing of ⅛Vref for an 8:3 priority encoder). The even spacing provided by the calibrated resistors 602a-h may facilitate accurate operation of the circuit 600.

In some embodiments, the resistors 602a-h may be coupled with the same bit line BL and source line BL, but different word lines (e.g., WL0, WL1, WL2, etc.) to allow separate calibration of the resistors 602a-h. In embodiments in which the individual resistors 602a-h include a plurality of resistor cells (e.g., in a series-parallel combination), the resistor cells of an individual resistor 602a-h may each be coupled to separate word lines to receive separate word line signals. The resistor cells of the individual resistor 602a-h may be coupled to the same fit line and/or source line. The calibration circuit may provide the bit line signal, source line signal, and/or word line signals.

Figure 7:
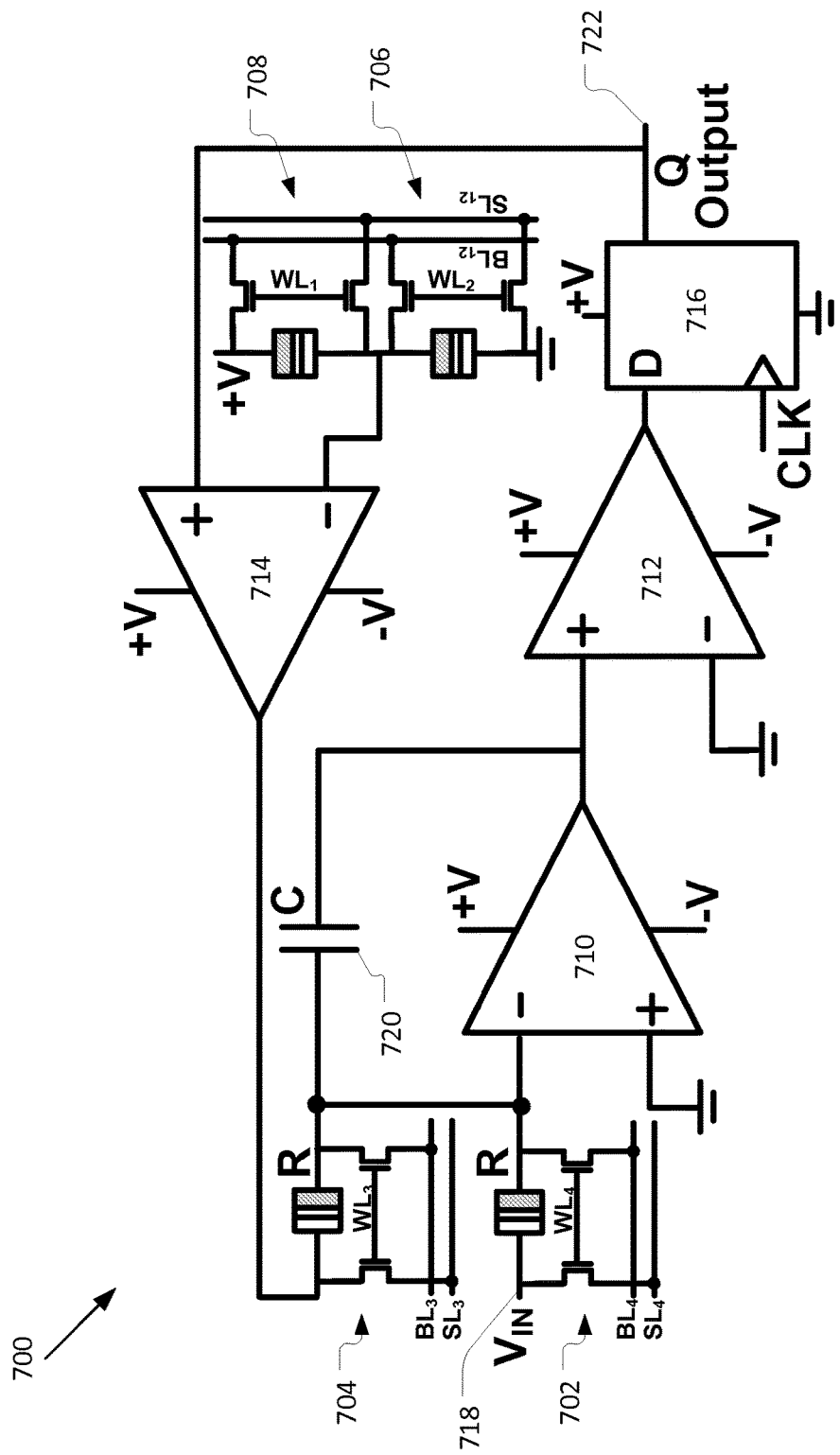
FIG. 7 schematically illustrates a sigma-delta ADC circuit including resistors with one or more resistive memory elements, in accordance with various embodiments.

FIG. 7 illustrates a sigma-delta ADC circuit 700 (hereinafter "circuit 700") in accordance with various embodiments. The circuit 700 may include resistors 702, 704, 706, and/or 708, one or more of which may include one or more resistive memory elements (e.g., similar to resistor 100 and/or 500) in various embodiments. The circuit 700 may further include various other circuit elements, such as, comparators 710, 712, and 714, and/or flip-flop 716. An input terminal 718 of the circuit 700 may receive an analog input signal and pass the analog input signal to an input of the comparator 710. An output of the comparator 710 may be coupled to an input of the comparator 712, and an output of the comparator 712 may be coupled to an input data terminal (D) of the flip-flop 716. An output of the flip-flop 716 may be coupled to an input of comparator 714.

Another input of the comparator 714 may be coupled to a voltage divider that includes resistors 706 and 708. An output of the comparator 714 may be fed back to the comparator 710 and/or 712. For example, the output of the comparator 714 may be coupled to an input of the comparator 710 via resistor 704 and to the input of the comparator 712 via the resistor 704 and a capacitor 720. The feedback loop of the circuit 700 may generate a digital output signal at an output terminal 722 coupled to the output of the flip-flop 716 that corresponds to the analog input signal at the input terminal 718. The digital output signal may be a multi-bit output signal clocked by the clock signal CLK received by the flip-flop 716.

Figure 8:
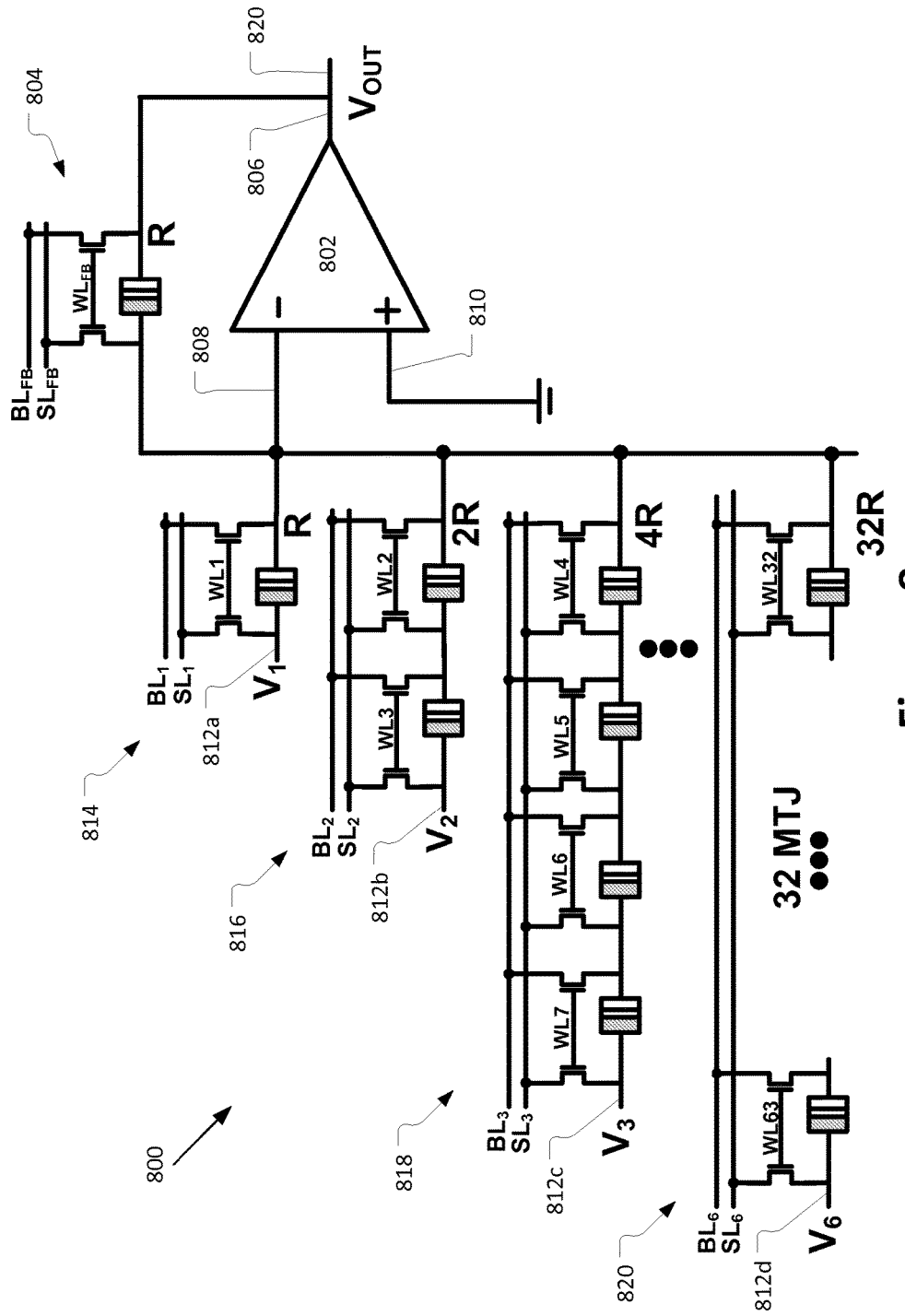
FIG. 8 schematically illustrates a binary weighted digital-to-analog conversion (DAC) circuit including resistors with one or more resistive memory elements, in accordance with various embodiments.

FIG. 8 illustrates a binary weighted resistive DAC circuit 800 (hereinafter "circuit 800") in accordance with various embodiments. The circuit 800 may include various other circuit elements, such as, an amplifier 802 with a feedback resistor 804 coupled between an output 806 and an input 808 of the amplifier 802. The other input 810 of the amplifier 802 may be coupled to ground. The circuit 800 may further include input terminals 812a-d that receive respective digital input signals (e.g., V1, V2, V3, etc.). The input terminals 812a-d may be coupled to the input 808 of the amplifier 802 via respective sets of resistors 814, 816, 818, or 820. The sets of resistors 814, 816, 818, and 820 may be binary weighted with respect to one another. For example, the resistor 814 may have a resistance of R, the resistors 816 may combine for a resistance of 2R, and the resistors 816 may combine for a resistance of 4R.

In various embodiments, each input signal may correspond to a bit of an input data signal. The binary weighting of the sets of resistors 814, 816, 818, and 820 may correspond with the relative values of the bits in the input data signal. For instance, in the example shown in FIG. 8, input signal V1 may be the most-significant bit of the input data signal, and may be coupled to resistor 814 having a resistance of R. Input signal V6 may be the least-significant bit of the input data signal, and may be coupled to the set of resistors 820 that provide a resistance of 32R. The amplifier 802 may generate an analog output signal at an output terminal 822 (coupled to the output of the amplifier 802) that has a value that corresponds to the value of the input data signal.

In various embodiments, one or more of the resistors 804, 814, 816, 818, and/or 820 may include one or more resistive memory elements (e.g., similar to resistor 100 and/or 500). In some embodiments, one or more of the resistors 804, 814, 816, 818, and/or 820 may be trimmable resistors that include one or more MTJ elements. The resistors 814, 816, 818, and/or 820 may be calibrated to provide the binary relationship between their respective resistances, and thereby provide an accurate output signal for the circuit 800.

Figure 9:
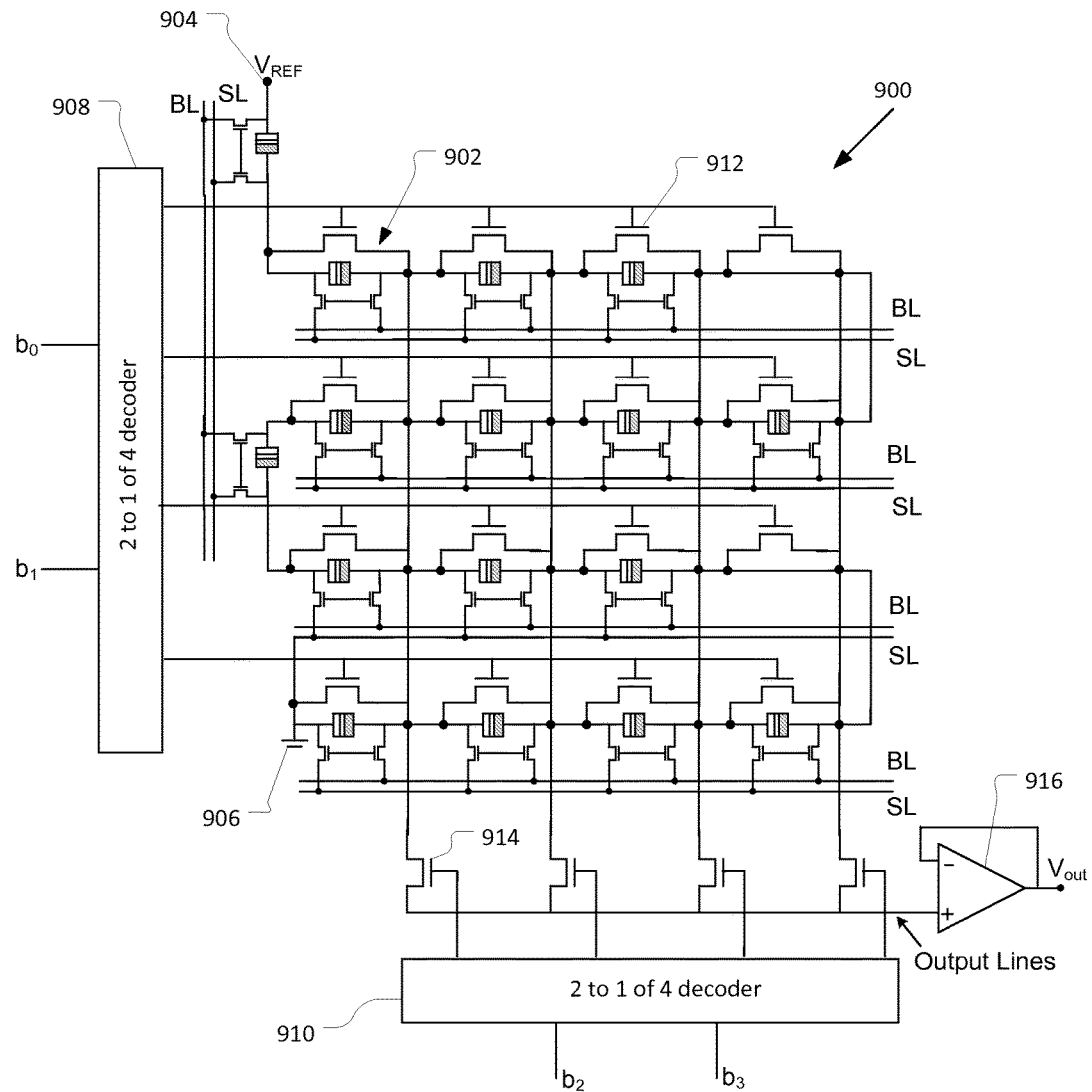
FIG. 9 schematically illustrates a two-dimensional resistive DAC circuit including resistors with one or more resistive memory elements, in accordance with various embodiments.
Figure 10:
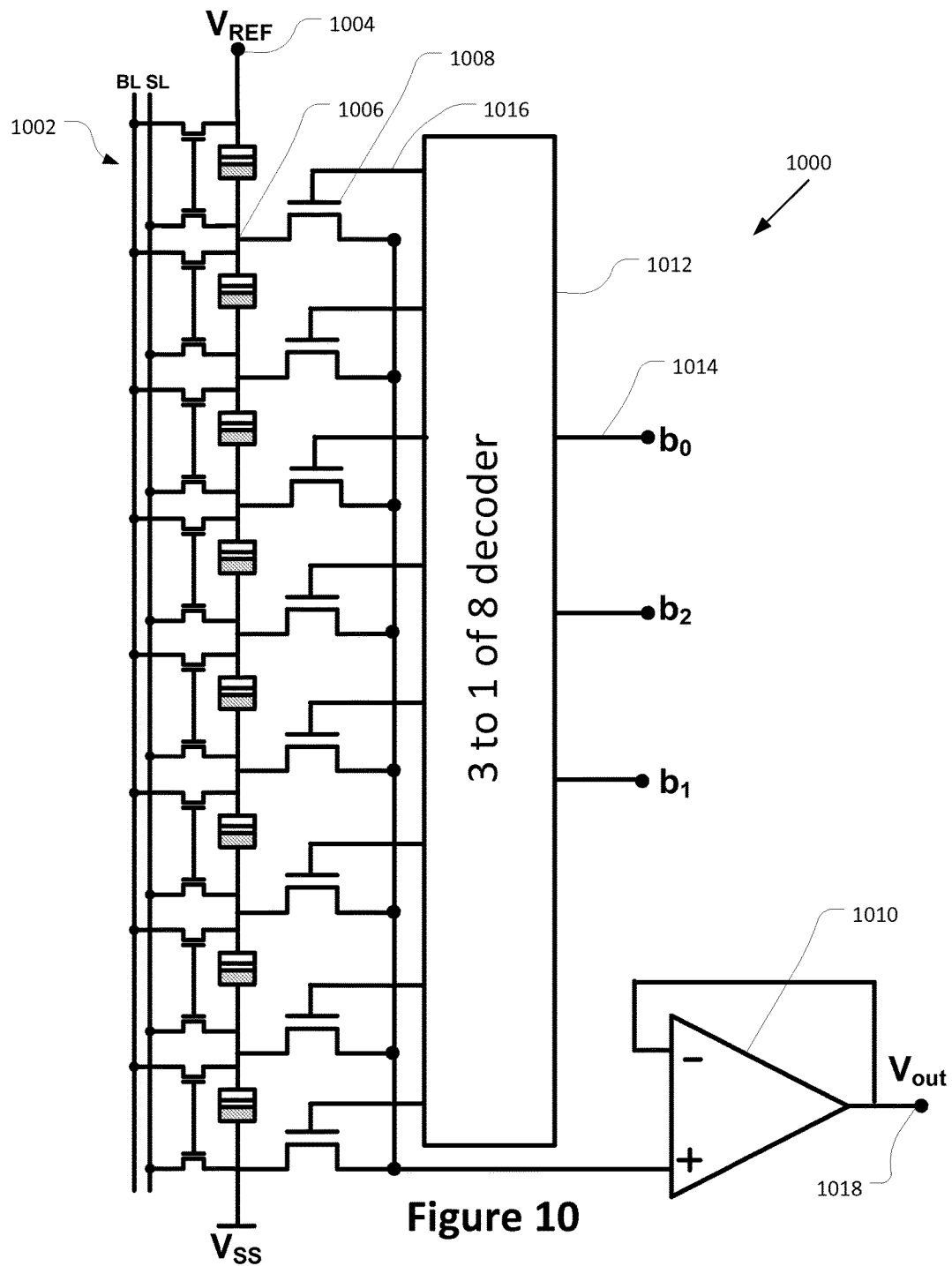
FIG. 10 schematically illustrates a thermometer-type DAC circuit including resistors with one or more resistive memory elements, in accordance with various embodiments.

FIG. 9 illustrates a two-dimensional resistive DAC circuit 900 (hereinafter "circuit 900") in accordance with various embodiments. The circuit 900 may include a plurality of resistors 902 that form a resistor ladder between a voltage reference terminal 904 that receives a reference voltage Vref and a ground terminal 906. The resistors 902 are arranged in rows and columns and coupled to other circuit elements, such as, decoders 908 and 910 as shown. One or more of the resistors 902 may include one or more resistive memory elements (e.g., similar to the resistor 100 and/or 500). For example, one or more of the resistors 902 may be a trimmable resistor that includes one or more MTJ elements.

Decoders 908 and 910 may receive different bits of the digital input signal and may generate respective output signals. For example, the decoders 908 and 910 may be 2 to 1 of 4 decoders that each receive 2 input bits of the digital input signal and generate 4 output signals based on the value of the 2 input bits. The output signals of the decoder 908 may selectively couple one or more rows of the resistors 902 with the transmission path (e.g., by turning off access transistors 912), while the output signals of the decoder 910 may selectively couple one or more columns of the resistors 902 (e.g., via access transistors 914) to the output amplifier 916. The output amplifier 916 may generate an analog output signal with a value based on the digital input signal.

In various embodiments, the resistors 902 may be calibrated to provide approximately equal resistance values to facilitate accurate operation of the circuit 900.

FIG. 1000 illustrates a thermometer-type DAC circuit 1000 (hereinafter "circuit 1000") in accordance with various embodiments. The circuit 1000 may include resistors 1002 that are arranged in a voltage ladder coupled to other circuit elements, such as reference voltage terminal 1004 that receives a reference voltage Vref. One or more of the resistors 1002 may include one or more resistive memory elements (e.g., similar to the resistor 100 and/or 500). For example, one or more of the resistors 1002 may be trimmable resistors that include one or more MTJs.

The voltage ladder may generate internal voltages at respective nodes 1006. Each node 1006 may be coupled to a respective transistor 1008 to selectively couple the node 1006 with an input of an output amplifier 1010. A decoder 1012 may receive respective bits of a digital input signal at input terminals 1014 and may set a number of output signals at respective output terminals 1016 to a logic 1 based on the value of the digital input signal. For example, the decoder 1012 may be a 3 to 1 of 8 decoder that receives a 3-bit digital input signal and sets 1 to 8 of the output signals to logic 1 based on the value of the digital input signal. The decoder 1012 may be coupled to pass the output signals to respective gate terminals of the transistors 1008.

Accordingly, the decoder 1012 may turn on one of the transistors 1008 based on the value of the digital input signal (the decoder may control the other transistors 1008 to be off). The transistor 1008 that is turned on may pass the internal voltage from the respective node 1006 to the output amplifier 1010, and the output amplifier 1010 may generate an analog output signal at an output terminal 1018. Accordingly, the analog output signal may have a value that corresponds to the value of the digital input signal.

In various embodiments, the resistors 1002 may be calibrated to provide the desired values for the intermediate voltages, thereby facilitating accurate operation of the circuit 1000.

Figure 11:
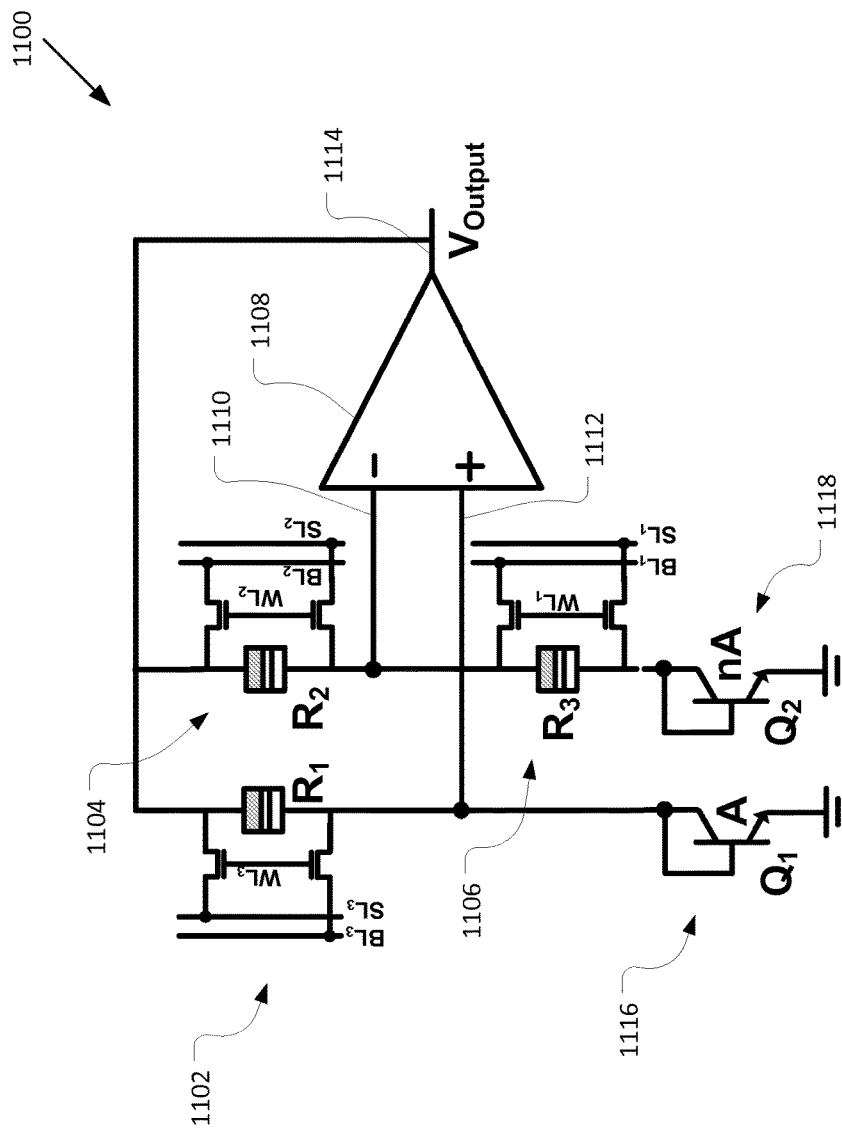
FIG. 11 schematically illustrates a bandgap reference circuit including resistors with one or more resistive memory elements, in accordance with various embodiments.

In various embodiments, the resistors described herein may additionally or alternatively be used in biasing circuits, such as bandgap reference circuits and/or bias generation circuits. For example, FIG. 11 illustrates a bandgap reference circuit 1100 (hereinafter "circuit 1100") in accordance with various embodiments. Circuit 1100 includes resistors 1102, 1104, and 1106, one or more of which may include one or more resistive memory elements (e.g., similar to the resistor 100 and/or 500).

Circuit 1100 may further include various other circuit elements, such as amplifier 1108 with a first input 1110, a second input 1112, and an output 1114. The output 1114 may be coupled to the first input terminal 1110 via resistor 1104, and may be coupled to the second input terminal 1112 via resistor 1102. A diode-connected transistor 1116 may be coupled between the second input terminal 1112 and ground, and a diode-connected transistor 1118 may be coupled in series with resistor 1106 between the first input terminal 1110 and ground. The circuit 1100 may generate a bandgap reference voltage at an output terminal 1120 coupled to the output 1114 of the amplifier 1108.

Figure 12:
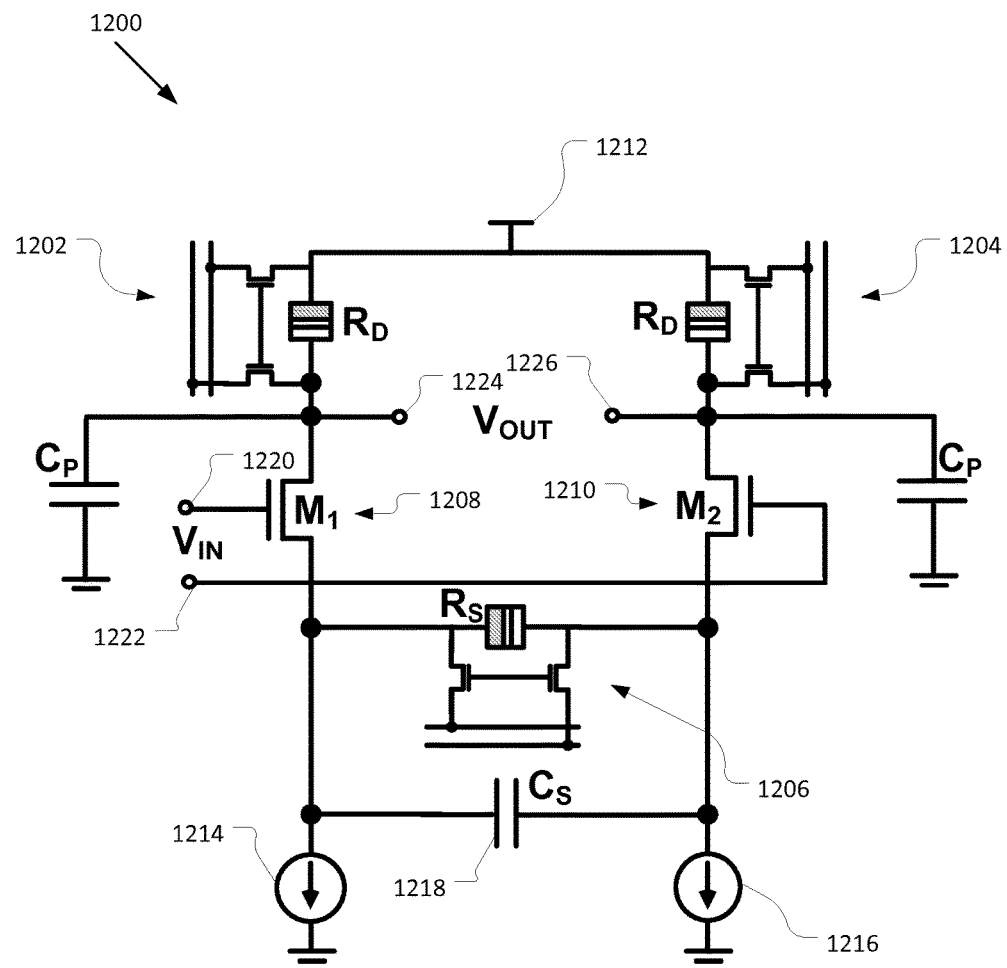
FIG. 12 schematically illustrates a continuous time linear equalizer circuit including resistors with one or more resistive memory elements, in accordance with various embodiments.

In various embodiments, the resistors described herein may additionally or alternatively be used in input/output (I/O) circuits, such as continuous time linear equalizers (CTLEs), poly-phase filters, termination resistors, and/or relaxation oscillators. For example, FIG. 12 illustrates a CTLE circuit 1200 (hereinafter "circuit 1200") in accordance with various embodiments. Circuit 1200 includes resistors 1202, 1204, and 1206, one or more of which may include one or more resistive memory elements (e.g., similar to the resistor 100 and/or 500).

The circuit 1200 may further include other circuit elements, such as a first transistor 1208 and a second transistor 1210. Resistor 1202 may be coupled between the drain of the first transistor 1208 and a voltage supply terminal 1212, and resistor 1204 may be coupled between the drain of the second transistor 1210 and the voltage supply terminal 1212. The circuit 1200 may further include a first current source 1214 coupled to the drain of the first transistor 1208, and a second current source 1216 coupled to the drain of the second transistor 1210.

The resistor 1206 may be coupled between the source terminals of the transistors 1208 and 1210. A capacitor 1218 may be coupled in parallel with the resistor 1206. The resistor 1206 and capacitor 1218 may help define the frequency response of the circuit 1200.

The circuit 1200 may receive a differential input signal Vin at input terminals 1220 and 1222 that are coupled to the gate terminals of respective transistors 1208 and 1210. The circuit 1200 may generate a differential output signal Vout at output terminals 1224 and 1226 that are coupled to the drain terminals of respective transistors 1208 and 1210.

In some embodiments, the circuit 1200 may be included in the analog front-end of a high speed serial I/O receiver. The circuit 1200 may significantly mitigate the impact of intersymbol interference in the channel. In various embodiments, the resistor 1206 may be tunable (e.g., by a calibration circuit) to allow tuning of the response of the circuit 1200 (e.g., based on channel characteristics and/or data rate). For example, the tunable resistor 1206 may allow control over the placement of the amplifier zero and hence the peaking frequency.

Tunable resistors may also be used in other CTLE circuits, such as those using active inductors (e.g., with the tunable resistor inserted in the gate-drain connection of a diode-connected MOSFET device) or circuits using passive inductors. For CTLE circuits with passive inductors, the passive inductor may not be tunable, so the tunable resistor may be used to adapt the response of the CTLE circuit to the channel conditions and improve performance in the serial I/O link.

Figure 13:
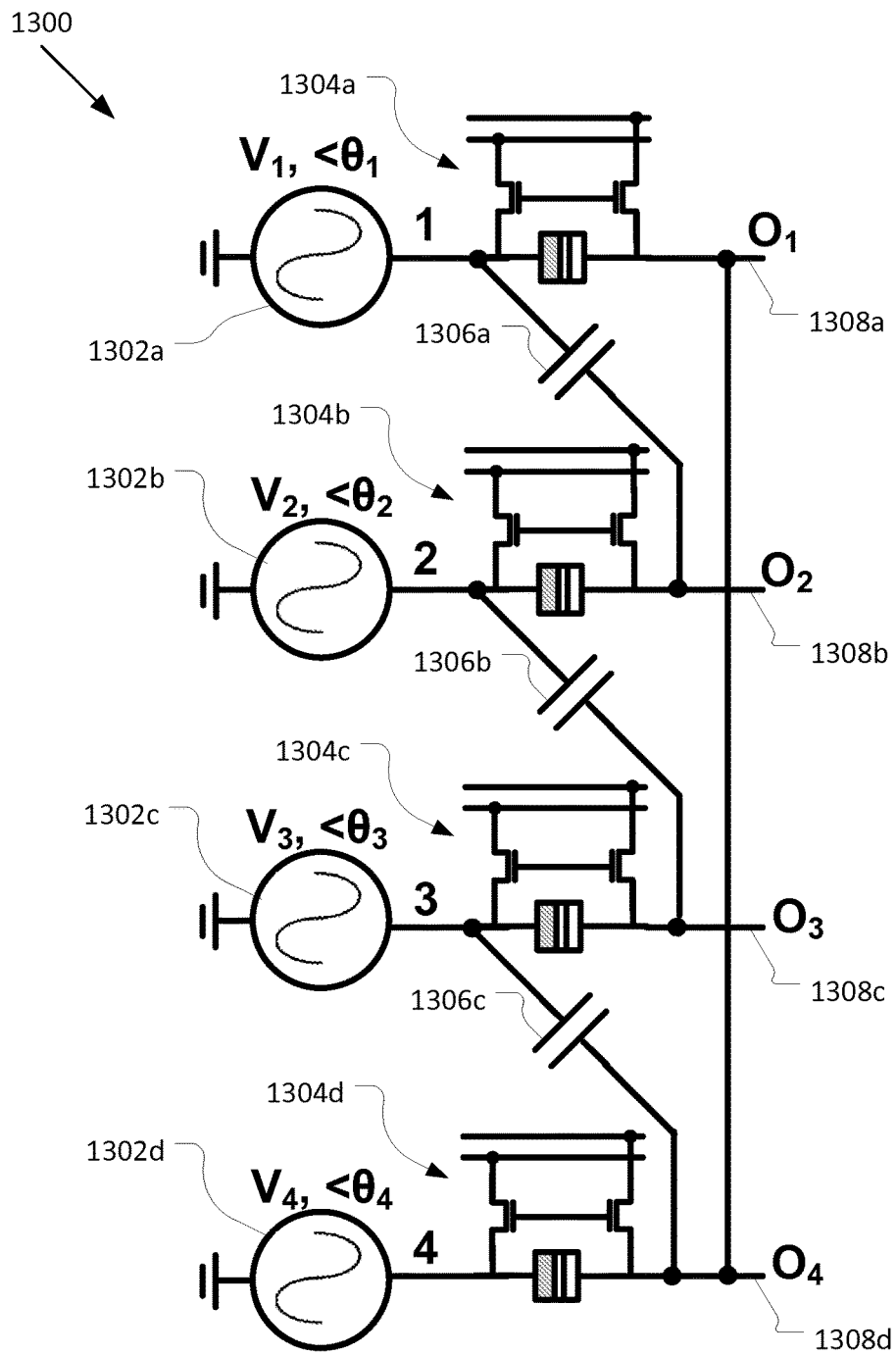
FIG. 13 schematically illustrates a poly-phase filter circuit including resistors with one or more resistive memory elements, in accordance with various embodiments.

FIG. 13 illustrates a poly-phase filter circuit 1300 (hereinafter "circuit 1300") in accordance with various embodiments. The circuit 1300 may include circuit elements, such as oscillators 1302a-d that generate oscillating signals with different phases. The circuit 1300 may further include resistors 1304a-d and capacitors 1306a-c coupled to one another as shown to form a symmetric RC network. For example, resistors 1304a-d may be coupled between the respective oscillator 1302a-d and a respective output node 1308a-d. Capacitor 1306a may be coupled between a node that is between the oscillator 1302a and the resistor 1304a and a node that is between the resistor 1304b and the output node 1308b. The other capacitors 1306b-c may be coupled in a similar manner, as shown. The circuit 1300 may generate output signals that are symmetrically disposed in relative phases (e.g., 0, 90, 180, 270 degrees).

The circuit 1300 may be included in a communication receiver, such as a wireless receiver. For example, the circuit 1300 may be used to generate balanced quadrature phases from a single phase, and/or to reject the image frequency. One or more of the resistors 1304a-d may include one or more resistive memory elements (e.g., similar to resistor 100 and/or 500). The resistance of the resistors 1304a-d may be adjusted to tune the response of the RC filters formed by the resistors 1304a-d and capacitors 1306a-c.

Figure 14:
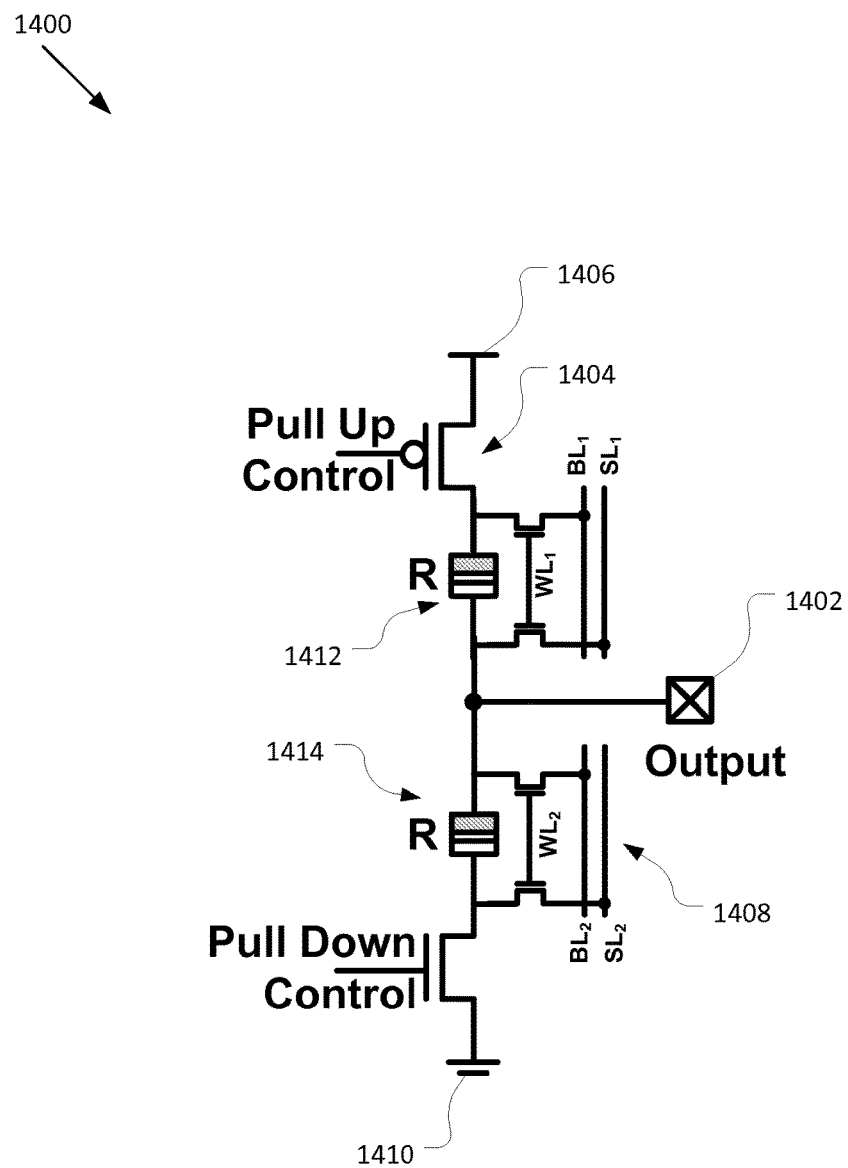
FIG. 14 schematically illustrates an input/output driver circuit including resistors with one or more resistive memory elements, in accordance with various embodiments.

FIG. 14 illustrates an I/O driver circuit 1400 (hereinafter "circuit 1400") in accordance with various embodiments. The circuit 1400 may include circuit elements, such as, an output terminal 1402, a pull-up transistor 1404 coupled between the output terminal 1402 and a first power supply terminal 1406, and a pull-down transistor 1408 coupled between the output terminal 1402 and a second power supply terminal 1410. In some embodiments, the second power supply terminal 1410 may be coupled to ground, as shown in FIG. 14. In other embodiments, the first power supply terminal 1406 may receive a positive voltage, and the second power supply terminal 1410 may receive a negative voltage.

In various embodiments, the circuit 1400 may further include a resistor 1412 coupled between the pull-up transistor 1404 and the output terminal 1402, and a resistor 1414 coupled between the pull-down transistor 1408 and the output terminal 1402. One or more of the resistors 1412 and 1414 may include one or more resistive memory elements (e.g., similar to the resistor 100 and/or 500).

In various embodiments, the pull-up transistor 1404 may receive a pull-up control signal at the gate terminal of the pull-up transistor 1404, and the pull-down transistor 1408 may receive a pull-down control signal at the gate terminal of the pull-down transistor 1408. The pull-up control signal and pull-down control signal may control the respective transistors 1404 and 1408 to drive an output signal at the output terminal 1402. For example, to drive the output signal to logic high, the pull-up control signal may turn on the pull-up transistor 1404 and the pull-down control signal may turn off the pull-down transistor 1408. To drive the output signal to logic low, the pull-down control signal may turn on the pull-down transistor 1408 and the pull-up control signal may turn off the pull-up transistor 1404.

In various embodiments, the resistance of the resistor 1412 and/or resistor 1414 may be tuned to improve switching response for the output signal.

Figure 15:
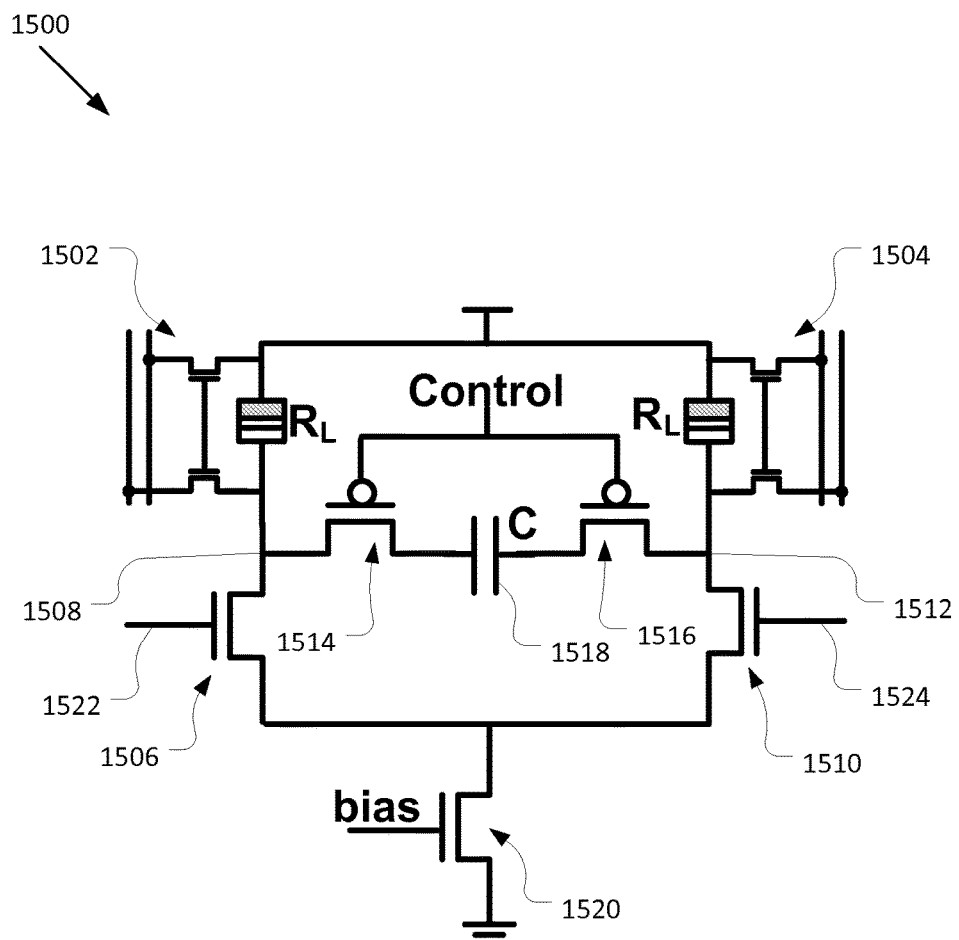
FIG. 15 schematically illustrates a resistance-capacitance oscillator circuit including resistors with one or more resistive memory elements, in accordance with various embodiments.

In some embodiments, the resistors described herein may be included in radio frequency (RF) circuits, such as differential resistance-capacitance (RC) oscillators, RC filters, and/or delay cells. For example, FIG. 15 illustrates a differential RC oscillator circuit 1500 (hereinafter "circuit 1500") in accordance with various embodiments. The circuit 1500 may include resistors 1502 and 1504 that may include one or more resistive memory elements (e.g., similar to resistor 100 and/or 500) in some embodiments.

The resistor 1502 may be coupled with various circuit elements, such as, transistor 1506 at a node 1508, and resistor 1504 may be coupled with various circuit elements, such as, transistor 1510 at a node 1512. Control transistors 1514 and 1516 may be coupled between node 1508 and node 1512, and a capacitor 1518 may be coupled between control transistors 1514 and 1516. The control transistors 1514 and 1516 may each receive a control signal. The circuit 1500 may further include a bias transistor 1520 coupled to a node between the transistors 1506 and 1510. The bias transistor 1520 may receive a bias signal.

In various embodiments, the circuit 1500 may receive an input signal at input terminals 1522 and 1524. The circuit 1500 may generate a differential oscillating output signal (e.g., a radio frequency output signal) at nodes 1508 and 1512 (also referred to as output terminals 1508 and 1512). The resistors 1502 and 1504 may be adjusted to tune the frequency of the output signal.

Differential oscillators may be used in, for example, high-speed clock and data recovery (CDR) circuits (e.g., for optical communication), analog and digitally controlled oscillators, frequency dividers of high-frequency synthesizers, clock generators of digital circuits, ADCs. The resistors described herein may be used as the resistor load in these circuits, e.g., to tune any mismatches in the differential stage.

Figure 16:
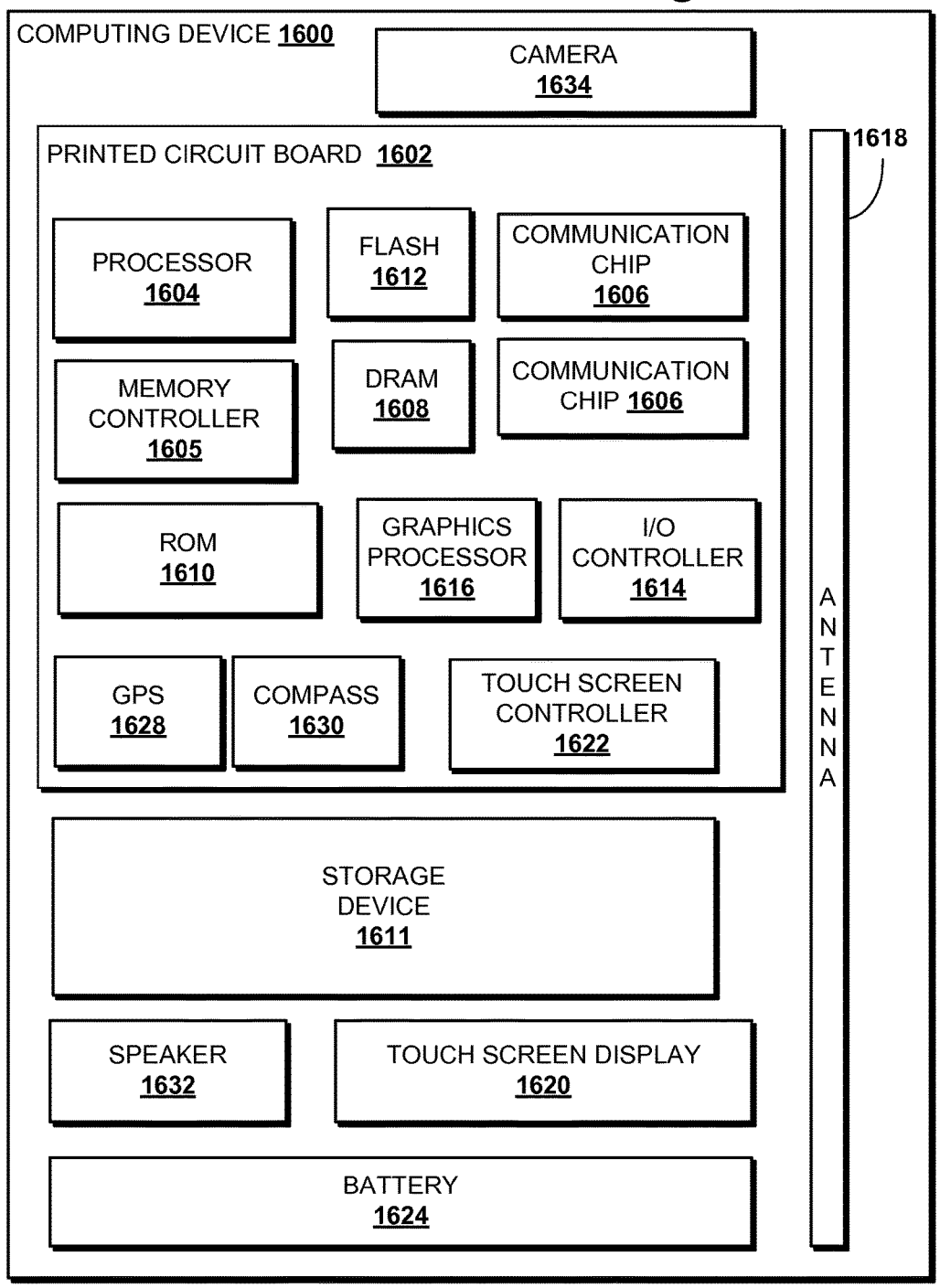
FIG. 16 illustrates an example system configured to employ the apparatuses and methods described herein, in accordance with various embodiments.

FIG. 16 illustrates an example computing device 1600 that may employ the apparatuses and/or methods described herein (e.g., resistor 100, MTJ element 200, MTJ element 300, resistor cell 400, resistor cell 401, resistor 500, circuit 600, circuit 700, circuit 800, circuit 900, circuit 1000, circuit 1100, circuit 1200, circuit 1300, circuit 1400, circuit 1500), in accordance with various embodiments. As shown, computing device 1600 may include a number of components, such as one or more processor(s) 1604 (one shown) and at least one communication chip 1606. In various embodiments, the one or more processor(s) 1604 each may include one or more processor cores. In various embodiments, the at least one communication chip 1606 may be physically and electrically coupled to the one or more processor(s) 1604. In further implementations, the communication chip 1606 may be part of the one or more processor(s) 1604. In various embodiments, computing device 1600 may include printed circuit board (PCB) 1602. For these embodiments, the one or more processor(s) 1604 and communication chip 1606 may be disposed thereon. In alternate embodiments, the various components may be coupled without the employment of PCB 1602.

Depending on its applications, computing device 1600 may include other components that may or may not be physically and electrically coupled to the PCB 1602. These other components include, but are not limited to, memory controller 1605, volatile memory (e.g., dynamic random access memory (DRAM) 1608), non-volatile memory such as read only memory (ROM) 1610, flash memory 1612, storage device 1611 (e.g., a hard-disk drive (HDD)), an I/O controller 1614, a digital signal processor (not shown), a crypto processor (not shown), a graphics processor 1616, one or more antenna 1618, a display (not shown), a touch screen display 1620, a touch screen controller 1622, a battery 1624, an audio codec (not shown), a video codec (not shown), a global positioning system (GPS) device 1628, a compass 1630, an accelerometer (not shown), a gyroscope (not shown), a speaker 1632, a camera 1634, and a mass storage device (such as hard disk drive, a solid state drive, compact disk (CD), digital versatile disk (DVD)) (not shown), and so forth. In various embodiments, the processor 1604 may be integrated on the same die with other components to form a System on Chip (SoC).

In some embodiments, the one or more processor(s) 1604, flash memory 1612, and/or storage device 1611 may include associated firmware (not shown) storing programming instructions configured to enable computing device 1600, in response to execution of the programming instructions by one or more processor(s) 1604, to practice all or selected aspects of the methods described herein. In various embodiments, these aspects may additionally or alternatively be implemented using hardware separate from the one or more processor(s) 1604, flash memory 1612, or storage device 1611.

In various embodiments, one or more components of the computing device 1600 may include one or more resistors that employ one or more resistive memory elements as described herein. For example, the resistors with one or more resistive memory elements may be included in processor 1604, I/O controller 1614, memory controller 1605, and/or another component of computing device 1600. Additionally, or alternatively, one or more components of the computing device 1600 may include the circuit 600, circuit 700, circuit 800, circuit 900, circuit 1000, circuit 1100, circuit 1200, circuit 1300, circuit 1400, and/or circuit 1500 described herein.

The communication chips 1606 may enable wired and/or wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1606 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 1600 may include a plurality of communication chips 1606. For instance, a first communication chip 1606 may be dedicated to shorter range wireless communications such as Wi-Fi and Bluetooth, and a second communication chip 1606 may be dedicated to longer range wireless communications such as GPS, EDGE, GPRS, CDMA, WiMAX, LTE, Ev-DO, and others.

In various implementations, the computing device 1600 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 1600 may be any other electronic device that processes data.

Some non-limiting Examples are presented below.

Example 1 is a circuit comprising: one or more circuit elements to process an analog signal on a signal path; and a resistor coupled with the signal path to pass the analog signal along the signal path, the resistor including a plurality of resistor cells coupled to one another in a series-parallel combination, and individual resistor cells of the plurality of resistor cells including one or more resistive memory elements.

Example 2 is the circuit of Example 1, wherein respective resistances of individual resistor cells of the plurality of resistor cells are digitally adjustable to adjust an overall resistance of the resistor.

Example 3 is the circuit of Example 2, wherein the individual resistive memory elements include a magnetic tunnel junction (MTJ) element.

Example 4 is the circuit of Example 3, wherein the MTJ element is coupled on the signal path and includes a free layer and a pinned layer, and wherein the individual resistor cells include: a source line to receive a source line signal; a bit line to receive a bit line signal; a word line to receive a word line signal; a first transistor coupled between the source line and the pinned layer of the MTJ element, a gate terminal of the first transistor coupled to the word line; and a second transistor coupled between the bit line and the free layer of the MTJ element, a gate terminal of the second transistor coupled to the word line.

Example 5 is the circuit of Example 1, wherein the individual resistive memory elements include a magnetic tunnel junction (MTJ) element coupled on the signal path, the MTJ element including a spacer layer disposed between two pinned layers.

Example 6 is the circuit of Example 1, wherein the individual resistive memory elements include a conducting bridge random access memory (CBRAM) resistive element, a phase change random access memory (PCRAM) resistive element, or a resistive random access memory (RRAM) resistive element.

Example 7 is the circuit of Example 1, wherein the resistor is disposed in one or more upper metal layers of the circuit that are above an active substrate region of the circuit.

Example 8 is the circuit of Example 1, wherein the circuit is a digital-to-analog conversion (DAC) circuit or an analog-to-digital conversion (ADC) circuit.

Example 9 is the circuit of Example 1, wherein the circuit is a biasing circuit, an input/output circuit, or a radio frequency circuit.

Example 10 is a circuit comprising: a signal path; and a resistor coupled with the signal path to pass a signal along the signal path, the resistor including: a magnetic tunnel junction (MTJ) element coupled on the signal path, the MTJ including a free layer and a pinned layer; a source line to receive a source line signal; a bit line to receive a bit line signal; a first transistor coupled between the source line and the pinned layer of the MTJ element; and a second transistor coupled between the bit line and the free layer of the MTJ element.

Example 11 is the circuit of Example 10, further comprising a word line to receive a word line signal, wherein a gate terminal of the first transistor and a gate terminal of the second transistor are coupled to the word line to receive the word line signal.

Example 12 is the circuit of Example 11, wherein, when the word line signal has a first value, the MTJ element is switchable between a first resistance and a second resistance based on a value of the source line signal and a value of the bit line signal.

Example 13 is the circuit of Example 11, wherein the resistor is a first resistor, the MTJ element is a first MTJ element, the word line is a first word line, and the word line signal is a first word line signal, and wherein the circuit further includes a second resistor that includes: a second word line to receive a second word line signal; a third transistor coupled between the source line and a pinned layer of the second MTJ element, a gate terminal of the third transistor coupled to the second word line; and a fourth transistor coupled between the bit line and a free layer of the second MTJ element, a gate terminal of the fourth transistor coupled to the second word line.

Example 14 is the circuit of Example 10, wherein the MTJ element, first transistor, and second transistor are included in a first resistor cell of the resistor, and wherein the resistor includes a plurality of resistor cells, including the first resistor cell, coupled in a series-parallel combination.

Example 15 is the circuit of Example 10, wherein the signal is an analog signal.

Example 16 is the circuit of Example 10, wherein the circuit is a radio frequency circuit.

Example 17 is the circuit of Example 10, wherein the circuit is a digital-to-analog conversion (DAC) circuit, an analog-to-digital conversion (ADC) circuit, a biasing circuit, or an input/output circuit.

Example 18 is the circuit of Example 10, further comprising a calibration circuit to control the bit line signal, the source line signal, and the word line signal to adjust a resistance of the resistor.

Example 19 is the circuit of Example 10, further comprising a passive resistor coupled in series with the MTJ element on the signal path, wherein a resistance of the passive resistor is greater than a maximum resistance of the MTJ element.

Example 20 is a computing system comprising: a memory; a processor coupled to the memory; and circuitry coupled to the processor and separate from the memory, the circuitry including a series-parallel combination of magnetic tunnel junction (MTJ) elements to form a resistor coupled with a signal path to pass an analog signal.

Example 21 is the system of Example 20, wherein the MTJ elements are included in respective resistor cells of the resistor and include a first MTJ element included in a first resistor cell of the resistor, and wherein the first resistor cell further includes: a source line to receive a source line signal; a bit line to receive a bit line signal; a word line to receive a word line signal; a first transistor coupled between the source line and a pinned layer of the first MTJ element, a gate terminal of the first transistor coupled to the word line; and a second transistor coupled between the bit line and a free layer of the first MTJ element, a gate terminal of the second transistor coupled to the word line.

Example 22 is the system of Example 21, wherein, when the word line signal has a first value, the first MTJ element is switchable between a first resistance and a second resistance based on a value of the source line signal and a value of the bit line signal.

Example 23 is the system of Example 21, further comprising a calibration circuit coupled to the resistor to control the bit line signal, the source line signal, and the word line signal to adjust a resistance of the resistor.

Example 24 is the system of Example 23, wherein the circuit is a radio frequency circuit, a digital-to-analog conversion (DAC) circuit, an analog-to-digital conversion (ADC) circuit, a biasing circuit, or an input/output circuit.

Example 25 is the system of Example 20, further comprising: a display coupled to processor; and an antenna coupled to the processor to communicate over a wireless communication network.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:
1. A circuit comprising:
one or more circuit elements to process an analog signal on a signal path; and
a resistor coupled with the signal path to pass the analog signal along the signal path, the resistor including a plurality of resistor cells coupled to one another in a series-parallel combination, wherein respective resistances of individual resistor cells of the plurality of resistor cells are adjustable to adjust an overall resistance of the resistor, and wherein individual resistor cells of the plurality of resistor cells include:
a resistive memory element coupled on the signal path and including first and second terminals;
a source line to receive a source line signal;
a bit line to receive a bit line signal;
a first transistor coupled between the source line and the first terminal of the resistive memory element; and
a second transistor coupled between the bit line and the second terminal of the resistive memory element, wherein the signal path does not pass through the first and second transistors.

2. The circuit of claim 1, wherein the respective resistances of individual resistor cells of the plurality of resistor cells are digitally adjustable.

3. The circuit of claim 1, wherein the resistive memory element includes a magnetic tunnel junction (MTJ) element.

4. The circuit of claim 3, wherein the MTJ element includes a free layer coupled to the second terminal and a pinned layer coupled to the first terminal, and wherein the individual resistor cells further include:

a word line to receive a word line signal, the word line coupled to a (late terminal of the first transistor and a gate terminal of the second transistor.

5. The circuit of claim 1, wherein the resistive memory element includes a conducting bridge random access memory (CBRAM) resistive element, a phase change random access memory (PCRAM) resistive element, or a resistive random access memory (RRAM) resistive element.

6. The circuit of claim 1, wherein the resistor is disposed in one or more upper metal layers of the circuit that are above an active substrate region of the circuit.

7. The circuit of claim 1, wherein the circuit is a digital-to-analog conversion (DAC) circuit or an analog-to-digital conversion (ADC) circuit.

8. The circuit of claim 1, wherein the circuit is a biasing circuit, an input/output circuit, or a radio frequency circuit.

9. A circuit comprising:
a signal path; and
a resistor coupled with the signal path to pass a signal along the signal path, the resistor including:
a magnetic tunnel junction (MTJ) element coupled on the signal path, the MTJ including a free layer and a pinned layer;
a source line to receive a source line signal;
a bit line to receive a bit line signal;
a first transistor coupled between the source line and the pinned layer of the MTJ element; and
a second transistor coupled between the bit line and the free layer of the MTJ element wherein the signal path does not pass through the first and second transistors.

10. The circuit of claim 9, further comprising a word line to receive a word line signal, wherein a gate terminal of the first transistor and a gate terminal of the second transistor are coupled to the word line to receive the word line signal.

11. The circuit of claim 10, wherein, when the word line signal has a first value, the MTJ element is switchable between a first resistance and a second resistance based on a value of the source line signal and a value of the bit line signal.

12. The circuit of claim 10, wherein the resistor is a first resistor, the MTJ element is a first MTJ element, the word line is a first word line, and the word line signal is a first word line signal, and wherein the circuit further includes a second resistor that includes:
a second word line to receive a second word line signal;
a third transistor coupled between the source line and a pinned layer of a second MTJ element, a gate terminal of the third transistor coupled to the second word line; and
a fourth transistor coupled between the bit line and a free layer of the second MTJ element, a gate terminal of the fourth transistor coupled to the second word line.

13. The circuit of claim 9, wherein the MTJ element, first transistor, and second transistor are included in a first resistor cell of the resistor, and wherein the resistor includes a plurality of resistor cells, including the first resistor cell, coupled in a series-parallel combination.

14. The circuit of claim 9, wherein the signal is an analog signal.

15. The circuit of claim 9, wherein the circuit is a radio frequency circuit.

16. The circuit of claim 9, wherein the circuit is a digital-to-analog conversion (DAC) circuit, an analog-to-digital conversion (ADC) circuit, a biasing circuit, or an input/output circuit.

17. The circuit of claim 9, further comprising a calibration circuit to control the bit line signal, the source line signal, and a word line signal to adjust a resistance of the resistor.

18. The circuit of claim 9, further comprising a passive resistor coupled in series with the MTJ element on the signal path, wherein a resistance of the passive resistor is greater than a maximum resistance of the MTJ element.

19. A system comprising:
a memory;
a processor coupled to the memory; and
circuitry coupled to the processor and separate from the memory, the circuitry including a series-parallel combination of magnetic tunnel junction (MTJ) elements to form a resistor coupled with a signal path to pass an analog signal, wherein the MTJ elements are included in respective resistor cells of the resistor and include a first MTJ element included in a first resistor cell of the resistor, and wherein the first resistor cell further includes:
a source line to receive a source line signal;
a bit line to receive a bit line signal;
a word line to receive a word line signal;
a first transistor coupled between the source line and a pinned layer of the first MTJ element, a gate terminal of the first transistor coupled to the word line; and
a second transistor coupled between the bit line and a free layer of the first MTJ element, a gate terminal of the second transistor coupled to the word line, wherein the signal path does not pass through the first and second transistors.

20. The system of claim 19, wherein, when the word line signal has a first value, the first MTJ element is switchable between a first resistance and a second resistance based on a value of the source line signal and a value of the bit line signal.

21. The system of claim 19, further comprising a calibration circuit coupled to the resistor to control the bit line signal, the source line signal, and the word line signal to adjust a resistance of the resistor.

22. The system of claim 21, wherein the circuit is a radio frequency circuit, a digital-to-analog conversion (DAC) circuit, an analog-to-digital conversion (ADC) circuit, a biasing circuit, or an input/output circuit.

23. The system of claim 19, further comprising:
a display coupled to the processor; and
an antenna coupled to the processor to communicate over a wireless communication network.

* * * * *

UNITED STATES PATENT AND TRADEMARK OFFICE
CERTIFICATE OF CORRECTION

PATENT NO. : 9,589,615 B2
APPLICATION NO. : 14/750670
DATED : March 7, 2017
INVENTOR(S) : Jaydeep P. Kulkarni et al.

It is certified that error appears in the above-identified patent and that said Letters Patent is hereby corrected as shown below:

In the Claims

Column 17
Line 2, "...(late..." should read – "...gate..."

Signed and Sealed this
Sixteenth Day of April, 2019

Andrei Iancu
*Director of the United States Patent and Trademark Office*